United States Patent [19]
Marbot et al.

[11] Patent Number: 5,596,285
[45] Date of Patent: Jan. 21, 1997

[54] IMPEDANCE ADAPTATION PROCESS AND DEVICE FOR A TRANSMITTER AND/OR RECEIVER, INTEGRATED CIRCUIT AND TRANSMISSION SYSTEM

[75] Inventors: Roland Marbot, Versailles; Jean-Claude Le Bihan, Montrouge; Andrew Cofler, Paris; Reza Nezamzadeh-Moosavi, Bois d'Arcy, all of France

[73] Assignee: Bull S.A., Louveciennes, France

[21] Appl. No.: 293,190

[22] Filed: Aug. 19, 1994

[30] Foreign Application Priority Data

Aug. 19, 1993 [FR] France ................................. 93 10106

[51] Int. Cl.$^6$ ........................ H03K 17/16; H03K 19/0175
[52] U.S. Cl. ............................................. 326/30; 326/83
[58] Field of Search ............................... 326/30, 83, 86

[56] References Cited

U.S. PATENT DOCUMENTS

| | | | |
|---|---|---|---|
| 5,095,231 | 3/1992 | Sartori et al. | 326/30 |
| 5,107,230 | 4/1992 | King | 326/30 |
| 5,134,311 | 7/1992 | Biber et al. | 326/30 |
| 5,162,672 | 11/1992 | McMahan et al. | 326/30 |
| 5,329,190 | 7/1994 | Igarashi et al. | 326/30 |
| 5,341,039 | 8/1994 | Fukumoto | 326/30 |
| 5,371,420 | 12/1994 | Nakao | 326/30 |

FOREIGN PATENT DOCUMENTS

| | | |
|---|---|---|
| 0463316 | 4/1991 | European Pat. Off. . |
| 0482392 | 10/1991 | European Pat. Off. . |
| 0520687 | 6/1992 | European Pat. Off. . |

Primary Examiner—Edward P. Westin
Assistant Examiner—Richard Roseen
Attorney, Agent, or Firm—Edward J. Kondracki; Kerkam, Stowell, Kondracki & Clarke, P.C.

[57] ABSTRACT

An integrated circuit (IC) includes a device (10) that adapts the impedance to the characteristic impedance (Zc) of transmission lines (13) each connecting a transmitter (11) to a receiver (12). Two adaptation blocks (14, 15) reproduce the respective structures of the transmitters (11) and receivers (12) and their impedance is adapted by a reference resistor (Rr). A closed loop control device (Len, Lep, Lrn, Lrp) reproduces the adaptation conditions in the transmitters (11) and receivers (12) respectively.

22 Claims, 5 Drawing Sheets

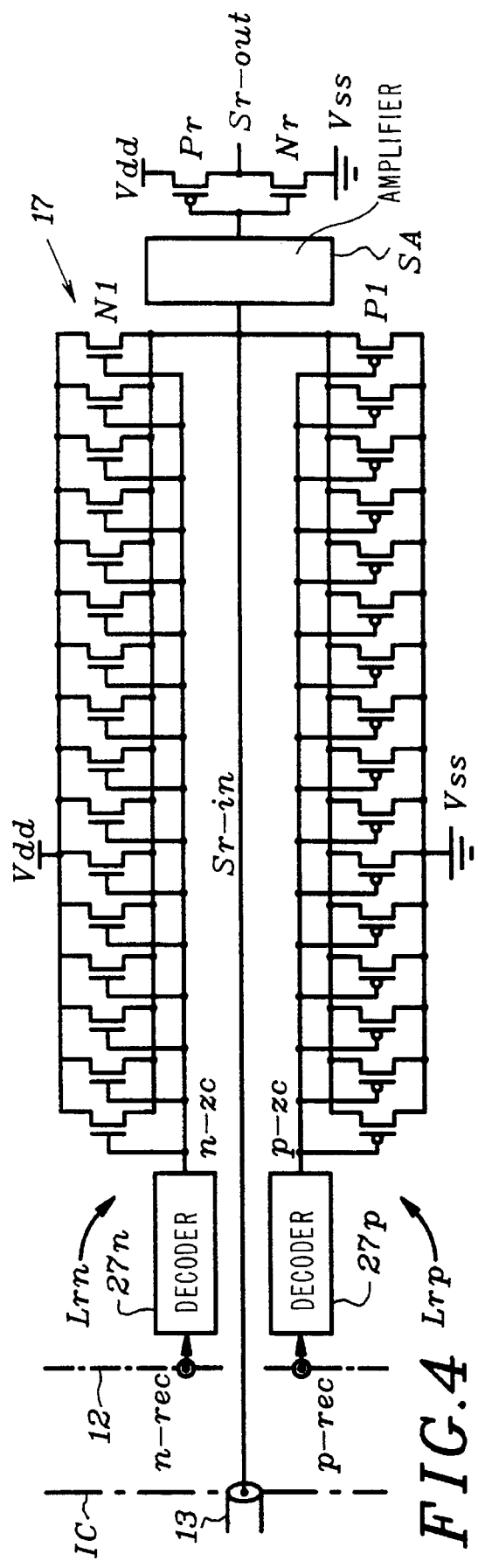
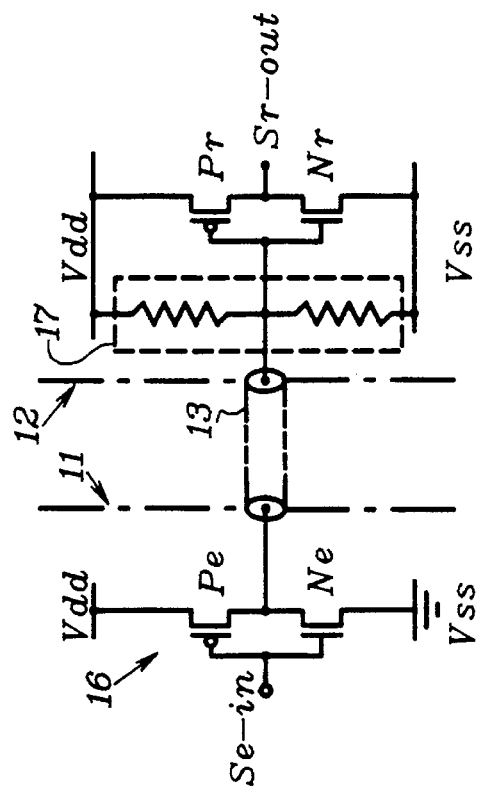
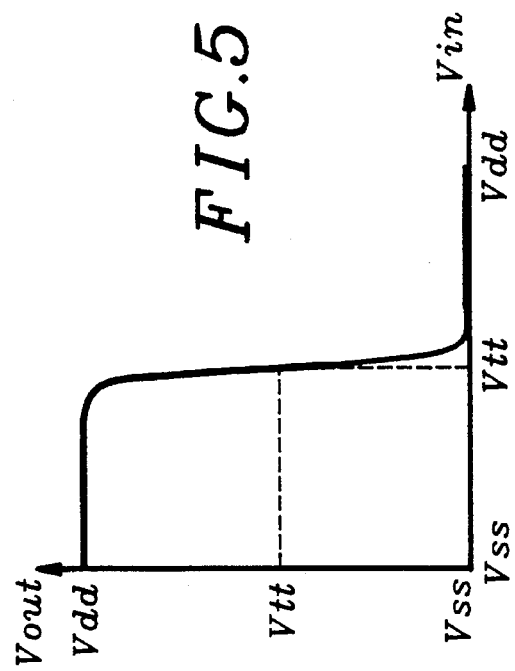
FIG.4
FIG.5
FIG.6

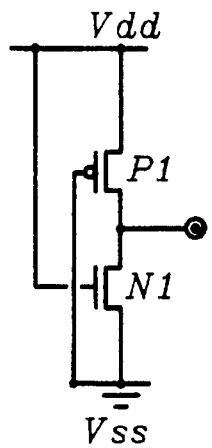
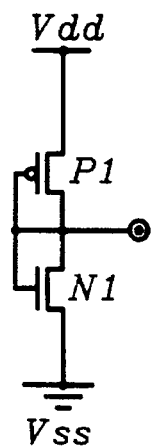
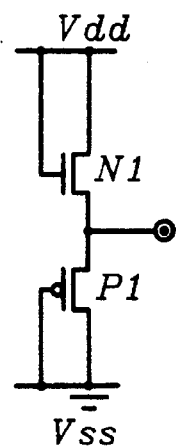
FIG.7A     FIG.7B     FIG.7C
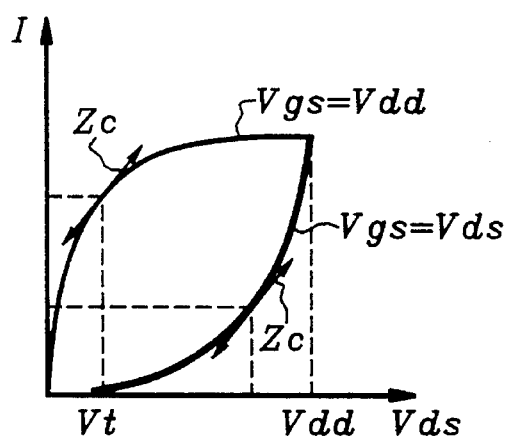
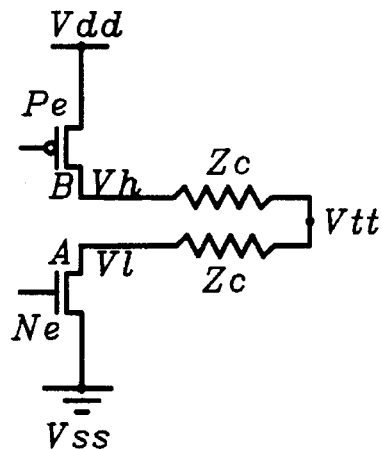
FIG.8     FIG.9
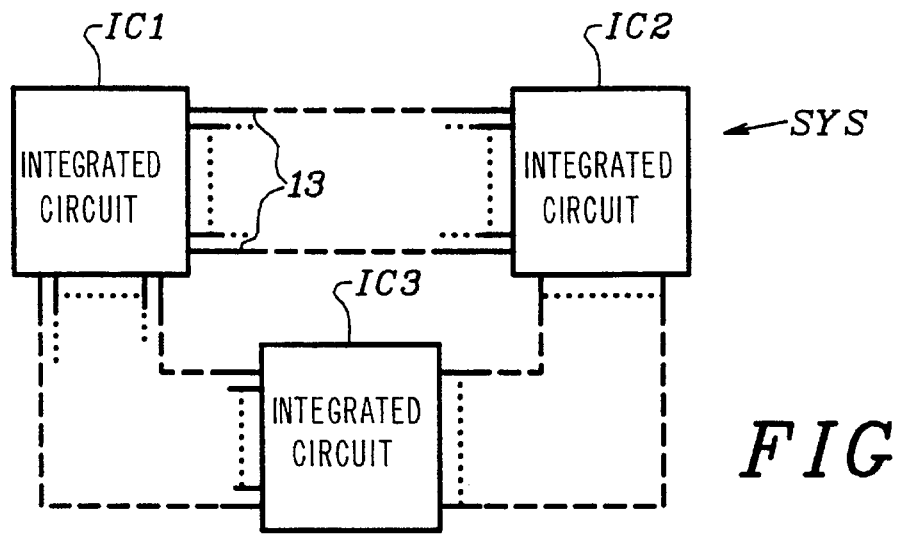
FIG.10

IMPEDANCE ADAPTATION PROCESS AND DEVICE FOR A TRANSMITTER AND/OR RECEIVER, INTEGRATED CIRCUIT AND TRANSMISSION SYSTEM

FIELD OF THE INVENTION

The invention relates to an impedance adaptation process and device for a transmitter and/or receiver, as well as an integrated circuit and transmission system.

BACKGROUND OF THE INVENTION

The integration of a transmitter and receiver that communicate through a transmission line poses two major problems. The first problem has to do with the transmission line's throughput. It is known that for high frequencies, a transmission line determined by its characteristic impedance is used, commonly called Zc, and similar to the equivalent resistance. At its two terminals the line is connected to two amplifiers respectively called buffers. The input buffer amplifies the power of the signals to be transmitted and the output buffer rearranges the signals received and amplifies them to be correctly processed by the receiver. On the other hand, binary signals are transmitted according to various codes marked by leading and trailing edges that alternate according to variable durations in proportions that may be greater than ten. In the area of gigabaud, the transmission signals may vary within a frequency band in excess of 500 MHz. However, each duty cycle must be transmitted without garbling to ensure the integrity and fidelity of the transmission. This requires the throughput time for each buffer to be fixed, regardless of the transmission frequency in the required band, the wave shape and the quality of the leading and trailing edges.

The second problem has to do with the technology for manufacturing integrated circuits. Bipolar technology offers the advantage of having rather stable characteristics, but it consumes considerable amounts of power. Field effect transistor technology consumes less power, particularly that of complementary transistors, for example, CMOS technology, but it greatly dissipates characteristics among the same components of two different integrated circuits. Thus, in this case, the idea is to make the transmitter and the receiver operate in a manner that is practically insensitive to such dissipation. Moreover, it is desirable for the transmission device to be independent from the technology selected to manufacture the transmitter and receiver. For example, a receiver made using MOS technology should do an equally good job of receiving the signals transmitted by a transmitter made using either MOS or bipolar technology, for example, the ECL (Emitter-Coupled Logic) type, characterized by a slight deviation of the output signals which is typically 0.8 volts.

The invention aims to solve the first problem, and more particularly in the difficult context of the second problem caused by the dissipation of the characteristics and the compatibility of the manufacturing technologies, by using an impedance adaptation process.

It is common knowledge that adapting the impedance for electromagnetic wave transmission can be accomplished in series or in parallel. Series adaptation consists of adapting the transmitter's output impedance to the line's characteristic impedance, leaving open its terminal close to the receiver. This adaptation has the advantage of not requiring static consumption. However, it has the disadvantage of being very sensitive to impedance variations on the line and of carrying full-swing signals. The result is great dynamic consumption and a reduced bandwidth, despite the advantage of not having to amplify the reception signal. Finally, it has been seen that the transmitter's output impedance in particular is poorly defined during switching, so that the adaptation cannot be optimized and varies with utilization conditions.

Parallel adaptation consists of adapting the receiver's input impedance to the line's characteristic impedance. This has the advantage of applying to a wide band of frequencies, but it has the dual disadvantage of commonly involving static consumption and using a signal with reduced deviation at the line's output. Moreover, it is difficult to adapt the receiver's input impedance to the line's characteristic impedance because signal transmission between integrated circuits has the disadvantage of having a heterogenous structure. The coaxial cable of the transmission line is frequently connected on each side, using a coaxial connector, to a printed circuit equipped with the box in an integrated circuit into which the transmitter or the receiver is built. Thus, the impedance of the connection of the coaxial cable to the integrated circuit varies significantly and hence creates interference reactance. However, it is desirable to maintain the characteristic impedance over the longest possible length of each transmission line. One common solution to this problem consists of adapting the receiver's input impedance to the transmission line's characteristic impedance by connecting an adaptation resistor at the end of the line. This resistor must have a fixed and specific value, ordinarily 50 ohms. In MOS technology, the technological drifts between integrated circuits prevent such a resistor from being integrated. Thus, the adaptation resistor is placed external to the integrated circuit as close as possible to the circuit. However, practice has shown that, even without reactance, and if the characteristic impedance can be maintained over the entire length of the line, a substantial length of the line is not adapted if the adaptation resistor is placed before the entry to the integrated circuit at the high frequencies that are planned (on the order of several GHz). One other possibility consists of entering and exiting the integrated circuit to place the adaptation resistor at the end of the line, external to the integrated circuit. But this solution has the disadvantage of requiring two output terminals instead of one per line, plus the installation of the same number of resistors as lines on the integrated circuit. Furthermore, the interference reactance on each line would be doubled.

The solution that is the subject of this invention consists of a parallel impedance adaptation process capable of correctly and reliably overcoming all the constraints posed by the two aforementioned problems.

SUMMARY OF THE INVENTION

The subject of the invention is a process for adapting the impedance to the characteristic impedance of a transmission line that connects a transmitter to a receiver, characterized in that it consists of determining a desired structure for the transmitter and the receiver as well as the desired operating conditions, reproducing the desired structure in an adaptation structure, connecting the adaptation structure to a reference impedance which, under the desired operating condition, adapts the impedance of the reproduced structure and brings the operation of the desired structure under the control of the adaptation structure.

As a corollary, the subject of the invention is a device to adapt the impedance to the characteristic impedance of a transmission line that connects a transmitter to a receiver, including in the transmitter and receiver a desired structure operating under desired conditions, characterized in that it includes an adaptation structure that reproduces the desired structure and is connected to a reference impedance which, under the desired operating conditions, adapts the impedance, and a device to bring the desired structure under the control of the adapted structure. The result is an integrated circuit in compliance with the invention, characterized in that it includes a transmitter and/or receiver to be connected to at least one transmission line and adapted to the characteristic impedance of the transmission line in accordance with the process identified above or incorporating an impedance adaptation device as identified above as well.

Another subject of the invention is a transmission system, including integrated circuits incorporating transmitters and/ or receivers connected to each other by transmission lines, characterized in that the integrated circuits are of the type identified above.

The invention is better shown by the following description of illustrative examples of the invention referring to the attached drawings.

BRIEF DESCRIPTION OF THE DRAWINGS

FIG. 4 is a schematic view of an example of the embodiment of a receiver connected to an impedance adaptation device illustrated in FIG. 2 to be adapted to the characteristic impedance of a transmission line according to the impedance adaptation process in accordance with the invention;

FIG. 5 is a graph showing the typical input-output transfer characteristic of a CMOS inverter used as an example of an amplifier in the transmitter and the receiver illustrated in FIGS. 3 and 4;

FIG. 6 illustrates an assembly used as the basis for the example of the embodiment of the transceiver illustrated in FIGS. 3 and 4;

FIGS. 7A, 7B and 7C depict three variations of the embodiment of a resistive bridge using CMOS technology;

FIG. 8 is a graph illustrating the static characteristics of a MOS transistor assembled in the manner described in each of the examples illustrated in FIGS. 7A, 7B and 7C;

FIG. 9 is a schematic view of the design of adapting the impedance of the transmitter and receiver illustrated in FIGS. 3 and 4; and FIG. 10 is a block diagram of an example of the transmission system comprised of integrated circuits which implement the invention, such as the one partially illustrated in FIG. 1.

DETAILED DESCRIPTION OF THE PREFERRED EMBODIMENTS

Figure 1:
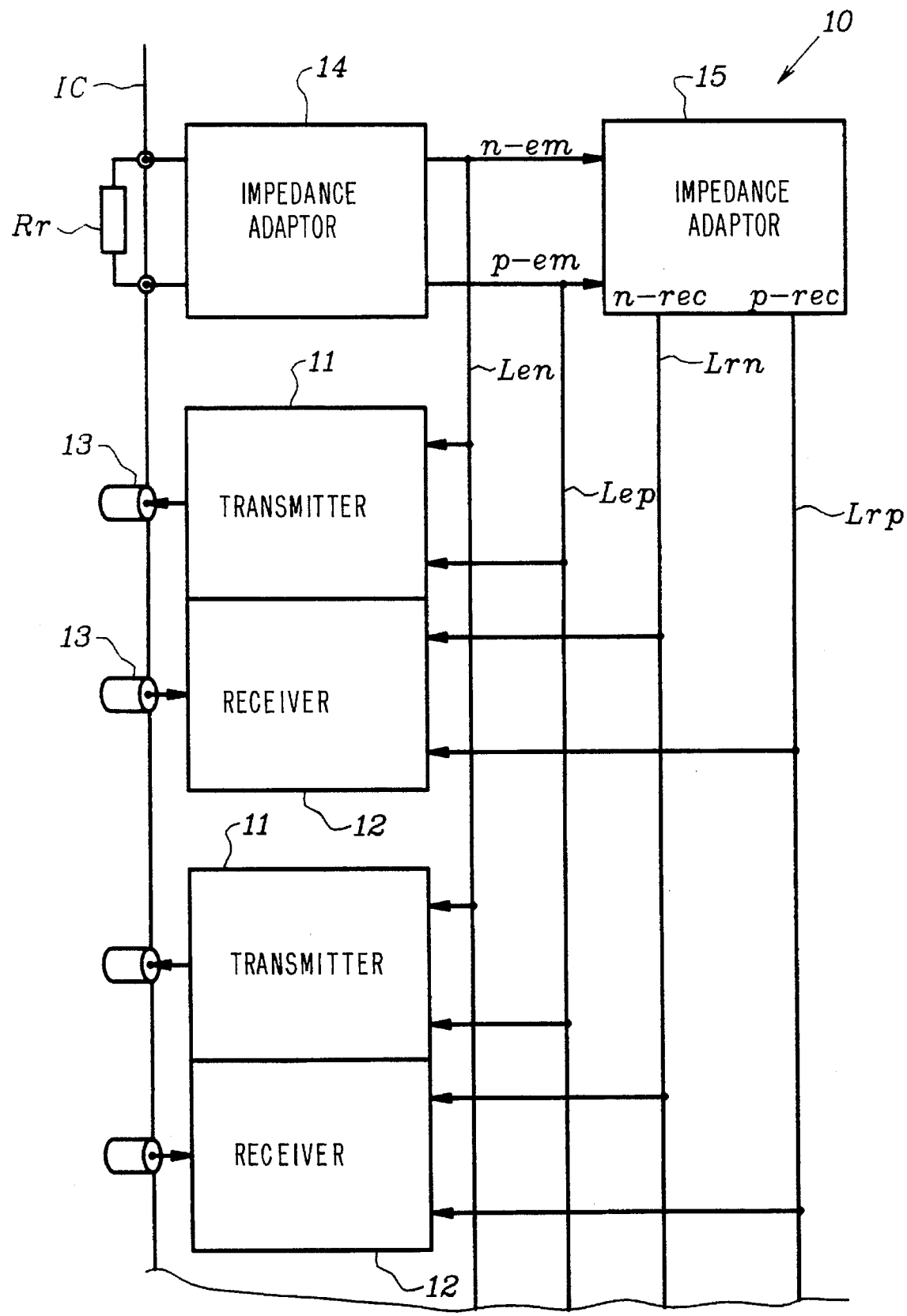
FIG. 1 is a block diagram of an impedance adaptation device in accordance with the invention, connected to at least one transceiver built into an integrated circuit which is partially illustrated.

FIG. 1 is a partial illustration in block form of an integrated circuit IC incorporating an impedance adaptation device 10 for at least one transceiver contained in the integrated circuit and comprising one transmitter 11 and one receiver 12.

The transmitter 11 and receiver 12 are connected to two unidirectional transmission lines 13 respectively with characteristic impedance Zc, ordinarily 50 ohms. In the example illustrated, the device 10 includes one impedance adaptation block 14 for all the transmitters 11 and one impedance adaptation block 15 for all the receivers 12. The device 10 and the transceivers 11, 12 of the integrated circuit IC selected as an example are made using CMOS technology and operate under two power supply potentials Vss and Vdd illustrated in FIGS. 2, 3 and 4, respectively. The ground is +3.3 volts in the embodiment method to be described below.

Figure 3:
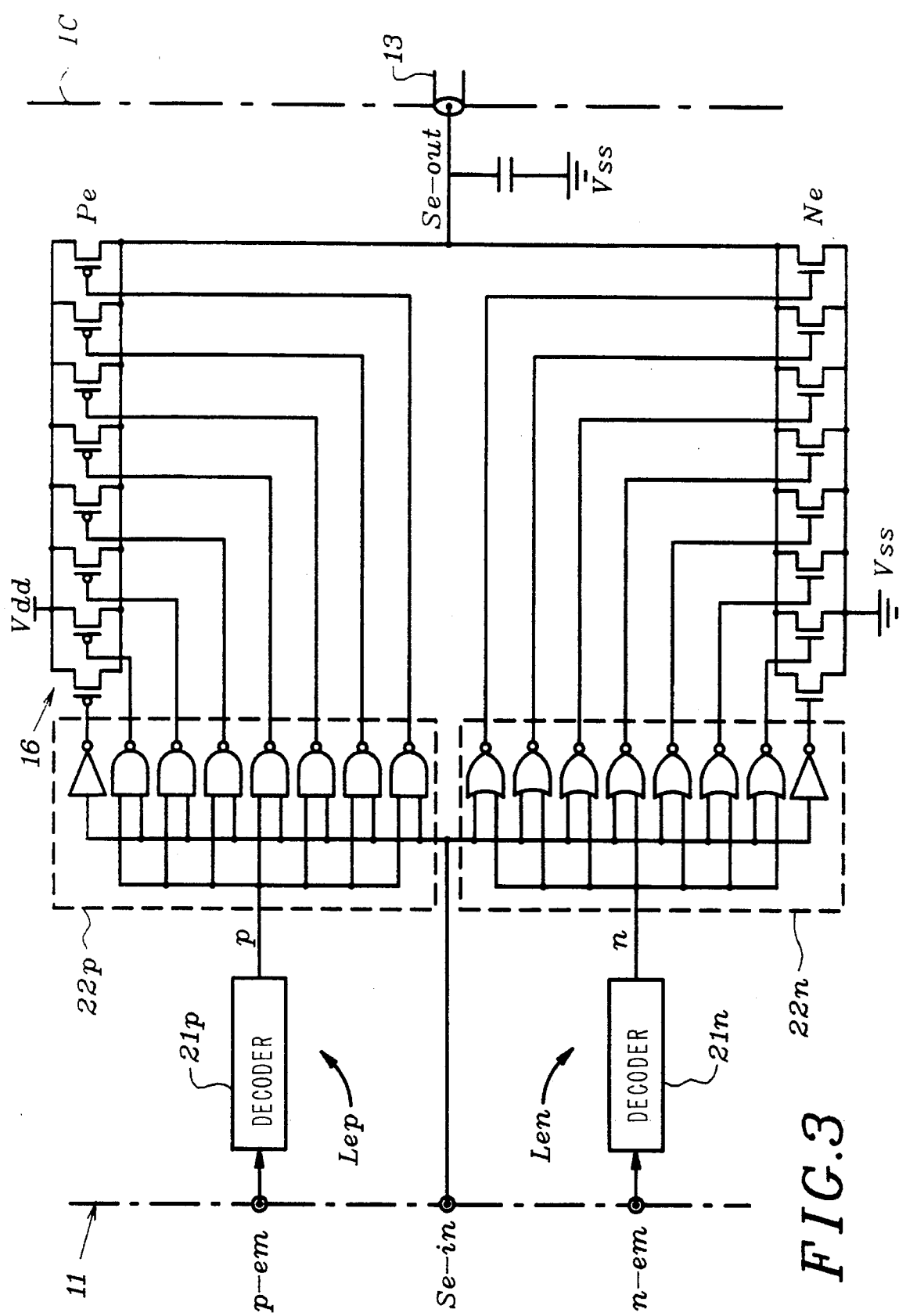
FIG. 3 is a schematic view of an example of the embodiment of a transmitter connected to the impedance adaptation device illustrated in FIG. 2 to be adapted to the characteristic impedance of a transmission line according to the impedance adaptation process in accordance with the invention.

The transmitter 11 illustrated in FIG. 3 was selected to perform this function from a transmission structure 16 corresponding to a conventional CMOS inverter with transistors Ne and Pe assembled in series between power supply potentials Vdd and Vss. In the structure illustrated, transistors Ne and Pe constitute two groups of eight respectively in which their drain-source current paths are in parallel. Their grids are designed to receive the transmission input signal Se-in selectively and their drains are connected to one of the transmission lines 13 to supply the out transmission signal Se-out 13.

Receiver 12 illustrated in FIG. 4 was selected to perform this function also from a conventional CMOS inverter with transistors Nr and Pr assembled in series between power supply potentials Vdd and Vss. Their grids receive in common the receive input signal Sr-in from one of the transmission lines 13 and their common drains deliver the output reception signal Sr-out. The invention process which consists of making a parallel adaptation was also selected to determine the input impedance for receiver 12 using a resistive bridge 17 and adapting this impedance to the characteristic impedance of line 13. The resistive bridge 17 is made of two adjustable resistors assembled in series between power supply potentials Vdd and Vss whose common point is connected to the grids of transistors Nr and Pr, preferably via an editing amplifier SA from the receive input signal Sr-in signal. In the example illustrated, the adjustable resistors are made of respective groups of sixteen transistors N1 and P1 assembled in parallel and selected by activating their grids. The transistors N1 are directly connected to the Vdd potential and the transistors P1 are directly connected to the Vss potential.

Figure 2:
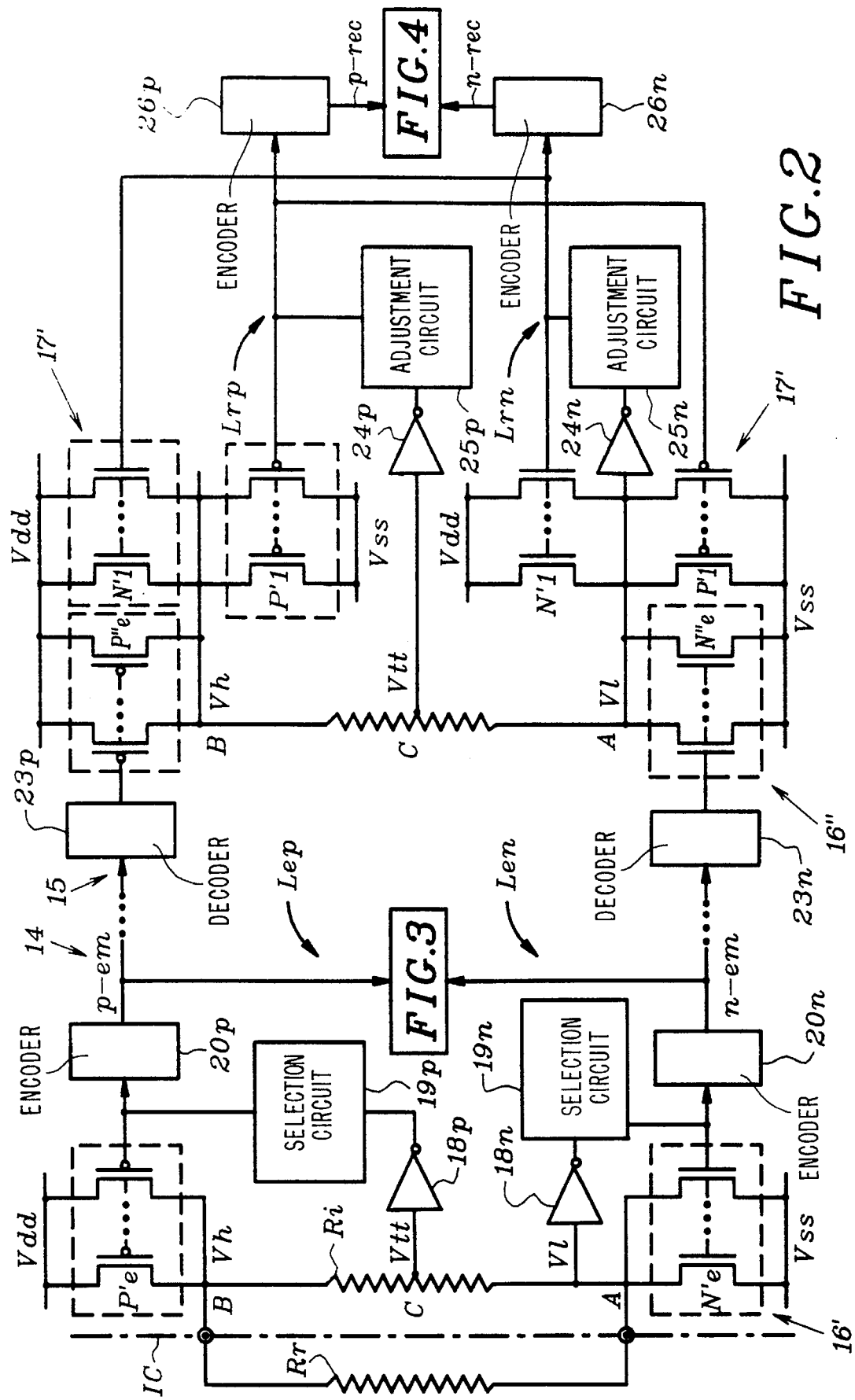
FIG. 2 is a schematic view of an example of the embodiment of an impedance adaptation device in accordance with the invention.

The impedance adaptation block 14 of the example illustrated in FIG. 2 includes a transmission reference structure 16' reproducing the transmission structure 16 of the transmitter 11. The transmission reference structure 16' illustrated thus includes two respective groups of eight transistors N'e, P'e in series between potentials Vdd and Vss. Their grids are also selectively activated in each group. The drains of the two transistors groups N'e and P'e are connected to two respective points A and B. Structure 16' also includes a reference resistor Rr connected to points A and B. The reference resistor RR must have, a precise predetermined value that cannot be obtained from a resistor integrated into the integrated circuit IC. The resistor RR is therefore a non-integrated resistor and is therefore known as one that is external to the integrated circuit IC. In the example selected, its value is twice the characteristic impedance Zc of the transmission lines 13 and thus has a value of 100 ohms in this case. The low potential is called Vl at point A and the high potential Vh at point B. The structure 16' also includes an intermediate resistor Ri also connected between points A and B with a value of no less than 2,000 ohms to have a negligible influence on the value of the reference resistor Rr. The intermediate resistor Ri is integrated into the IC circuit and is used to measure the Vtt potential at its mid point C.

Besides the structure 16', block 14 includes two control loops Len and Lep. In the Len loop, the potential Vl at point A is applied to the input of a comparator 18$n$ to be compared with the desired potential of Vi. The difference signal at the output of the comparator 18 is applied to the input of a selection circuit 19$n$, whose output activates the transistor grids N'e selected and is also applied to an encoder 20$n$. The encoder 20 delivers a control signal n-em to an output terminal of block 14. Similarly, in the loop Lp, the potential Vtt at point B is applied to the input of the comparator 18$p$ to be compared with the desired value of the potential Vtt. The difference signal at the output of the comparator 18$p$ is applied to the input of a selection circuit 19$p$ including the active output, the grids of the transistors P'e selected and is also applied to an encoder 20$p$. The encoder 20P delivers a control signal p-em to an output terminal of block 14. In the example illustrated, the two encoders 20$n$ and 20$p$ determine the mean values of the selection signals and encode both mean values to supply the control signals n-em and p-em encoded in the form of three bits (0:2).

As indicated in FIGS. 1, 2 and 3, the control signals n-em and p-em in the transmission control loops Len and Lep are applied to two control inputs of the transmitter 11. The two control signals n-em and p-em are applied to the respective decoders 21$n$ and 21$p$ which deliver the selection signals n and p, eight bits in this case (0:7). Loops Len and Lep also include two respective selection circuits 22$n$ and 22$p$ to select the transistors Ne and Pe in response to the signals n and p. The illustrated selection circuit 22$n$ includes seven NOR gates with two inputs and one inverter, whose outputs are connected to the respective grids of the eight transistors Ne. The input of the inverter and one input of the seven NOR gates receive the input signal Se-in whereas the other input of the seven NOR gates receives the selection signal n. The selection circuit 22$p$ illustrated is made of seven NAND gates with two inputs and one inverter, and their outputs are connected to the respective grids of the eight transistors Pe. The input of the inverter and one input of the seven NAND gates receive the input signal Se-in whereas the other input of the seven NAND gates receives the selection signal p.

The transmitter control signals n-em and p-em are also applied to two control inputs from the impedance adaptation block 15 of the receiver 12, illustrated in FIGS. 1 and 2. Block 15 includes a structure 16" similar to the structure 16' of block 14 which is comprised of two groups of eight transistors N"e and P"e, identical to groups N'e and P'e, connected to the respective power supply potentials Vss and Vdd and connected in series between points A and B by an intermediate resistor R'i identical to resistor Ri. The control signals n-em and p-em are decoded in the respective decoders 23$n$ and 23$p$ to adjust transistor groups N"e and P"e in the same manner as groups N'e and P'e of block 14. Consequently, potentials Vl and Vtt at points A and C are identical to those of block 14. These potentials are used as reference for two loops Lrn and Lrp to control resistors N1 and P1 of resistive bridge 17 of receiver 12. Block 15 therefore also comprises two resistive bridges 17' identical to bridge 17 and each therefore comprises the assembly in series of two groups of sixteen transistors N'1 and P'1 between the supply potentials Vdd and Vss. The sixteen transistors N'1 of the two bridges 17' are assembled in parallel between the potential Vdd and the respective points A and B of the structure 16', whereas the sixteen transistors P'1 of the two bridges are installed in parallel between the potential Vss and the respective points A and B. In each group, the transistors N'1 and P'1 are selectively activated by their grids.

In both receiver loops Lrn and Lrp, potentials Vl and Vtt at points A and C of block 15 are applied to the respective inputs of two comparators 24$n$ and 24$p$ to be compared with the corresponding desired values of Vl and Vtt. The output signals of comparators 24$n$ and 24$p$ are applied to the respective inputs of two adjustment circuits 25$n$ and 25$p$, whose respective outputs selectively activate the grids of transistors N'1 and P'1 and are applied to the inputs of two encoders 26$n$ and 26$p$ which deliver signals encoded n-rec and p-rec to two control output terminals of block 15, which represent the mean selection values of transistors N'1 and P'1.

As indicated in FIGS. 1 and 4, the control signals n-rec and p-rec of the two loops Lrn and Lrp are applied to two control input terminals of the receiver 12. Both control inputs are connected to two decoders 27$n$ and 27$p$ respectively, providing selection signals n-zc and p-zc, 16 bits each, to activate transistors N1 and P1 of bridge 17 in the same manner as transistors N'1 and P'1 of bridges 17' of block 15.

The operation of the transmission system 10 which has just been described as an example with reference to FIGS. 1 to 4 will now be presented. First, it is important to note that this example was designed to meet five requirements at the same time, and that these requirements were used as a highly restrictive example in order to highlight the characteristics and advantages of the invention. In other words, these requirements may be changed to be more or less restrictive, and are not necessarily cumulative as in the example selected. For instance, only one or more may be taken among the requirements indicated and/or still others from the domain of a skilled artisan.

The five requirements to be met are:

(1) design a CMOS amplifier with a wide bandwidth while maintaining the duty cycle, (2) adapt the receiver's input impedance, (3) design the transmitter to keep the deviation of voltage on the transmission line constant in order to be able to ensure the performance characteristics of the transmission, (4) provide good immunity to noise on the line and good rejection of common mode caused by voltage differences that may exist between the power supply voltages Vdd and Vss from the transmitter and receiver, and (5) ensure compatibility of input-output levels with the ECL components to operate with optical coupling circuits.

To resolve point (1), it was judged that the best and simplest current CMOS technology amplifier is the inverter comprised of two complementary transistors assembled in series between power supply voltages Vdd and Vss whose common grids receive the input signal and the common drains deliver the output signal, such as inverter 34 in FIG. 4. This inverter has an input-output transfer characteristic of the type illustrated in FIG. 5. The graph in FIG. 5 illustrates the variations of output potential Vout according to the variation of input potential Vin of the inverter. Potentials Vin and Vout vary between power supply potentials Vss and Vdd. It appears that this inverter is an amplifier solely in one part (called the range) of input potential Vin in which the output potential Vout varies between Vss and Vdd. However, the dissipations resulting from the manufacture of the integrated circuits mean that this range is more or less large according to the integrated circuits. Consequently, amplification distortions are avoided if the inverter's input is polarized at a potential Vtt corresponding to the middle of the amplification range and the middle of power supply potentials Vdd and Vss. The polarization can be made simply by a potentiometric divider, or resistive bridge, which may advantageously constitute the receiver's adaptation impedance Zc as well. The schematic diagram of this assembly is illustrated in FIG. 6. In this figure, the transmitter 11 includes the inverter 16 comprised of two complementary transistors Ne and Pe whose grids receive the transmission input signal Se-in and whose drains deliver transmission output signal Se-out to the transmission line 13. The receiver 12 comprises the inverter comprised of two complementary transistors Nr and Pr whose grids receive the receive input signal Sr-in from line 13 and whose drains receive the receive output signal Sr-out. The grids of the transistors Nr and Pr are also connected to the junction point of both resistors N1 and P1 assembled in series between voltages Vdd and Vss and constitute resistive bridge 17. Therefore, it appears that if the input of receiver 12 is in the air, inverter Nr, Pr is polarized in its amplification range, whereas its output is near the potential Vtt.

On the other hand, transmitter 11 must supply the most symmetrical signal possible on line 13. Transistors Ne and Pe are alternatively conductors to pass positive and negative alternances from the transmission output signal Se-out. If transistors Ne and Pe were pure sources of switchable current, the transmission would then be independent from the continuous power supply from the transmitter by potentials Vdd and Vss and would consequently be independent from the differences in the values of power supply potentials Vdd and Vss between transmitter 11 and receiver 12. Inverter 16 would then totally reject the common mode. But in practice, transistors Ne and Pe are not pure sources of switchable current and therefore do not totally reject the common power supply mode. However, this is still very good and very satisfactory. One solution that would provide total rejection of the common power supply mode would be to use differential transmission. Under the example of embodiment using CMOS technology planned for use with a very wide bandwidth, the characteristics of MOS transistors make it impossible to produce such a CMOS differential amplifier. However, it is clear that this solution could be used in another technology or to meet less restrictive requirements than the ones that were selected.

The assembly description in FIG. 6 therefore meets four of the five aforementioned requirements. In brief, it offers the widest bandwidth possible in the selected technology, it adapts the receiver's input to the characteristic of the impedance of the line and provides constant voltage deviation on the line. It also provides a good rejection of the common power supply mode provided that (a) the resistive bridge 17 of the receiver's input has an equivalent impedance equal to the characteristic impedance Zc of line 13 and that the receiver's input is placed at a polarization potential equal to the switching threshold Vtt of inverter Nr, Pr and (b) that output transistors Ne and Pe of the transmitter 11 are sized to provide symmetrical and, predetermined voltage deviation around polarization potential Vtt when the output load has an impedance equal to the characteristic impedance Zc of the line. The requirements (a) and (b) are met in the example illustrated by constituting the resistors of the resistive bridge 17 using CMOS transistors N1 and P1, as illustrated in FIG. 4, and by controlling transistors N1 and P1 as well as transmitter transistors Ne and Pe. In the example selected, resistors N1 and P1 of receiver 12 and output amplifier 16 of the receiver 11 are made respectively of groups of transistors assembled in parallel and activated selectively and simultaneously by a closed loop control device built into the integrated circuit IC that meets requirements (a) and (b). The closed loop control device is therefore comprised of two loops Len and Lep to control transistors Ne and Pe of the transmission amplifier and two loops Lrn and Lrp to control transistors N1 and P1 of the receiver's resistive bridge. Furthermore, to meet requirements (a) and (b), in the embodiment example, it is subjected to four requirements corollary to the aforementioned requirements:

the resistive bridge's polarization potential must be equal to the switching threshold Vtt of an inverter identical to reception amplifier Nr, Pr, in other words, produced using the same technology, supplied with power under the same potentials Vdd and Vss and operating at the same temperature, the impedance equivalent to the resistive bridge must be equal to the characteristic impedance Zc of line 13, typically 50 ohms, the voltage deviation on the transmission line must be fixed and determined in the example selected in such a way that it provides ECL compatibility which is typically 0.8 volts, and the voltage deviation on the line must be symmetrical around the threshold Vtt.

The structure of the resistive bridge 17 with two complementary transistors N1 and P1 assembled in series between power supply potentials Vdd and Vss may be made according to the three variants illustrated in FIGS. 7A, 7B and 7C. The two transistors N1 and P1 are both conductors for working in the resistive mode. There are two types of assembly according to which transistor P1 is connected to potential Vdd as illustrated in FIGS. 7A and 7B, or transistor N1 as in FIG. 7C. For each of these two types of assembly, the connection of the grid of transistor N1 to potential Vdd and of the grid of transistor P1 to potential Vss provides the two variants illustrated in FIGS. 7A and 7C. In FIG. 7A, Vgs=Vdd and in FIG. 7C, Vgs=Vds. In FIG. 7B, the grids are connected to the drains of both transistors, so that Vgs=Vds.

FIG. 8 is a graph illustrating the static characteristics of a MOS transistor assembled so that Vgs=Vdd (the curve with a narrow unbroken line) or Vgs=Vds (the curve with a wide unbroken line). The axes of the abscises represents the variations in voltage Vds from zero volts to potential Vdd, whereas the axis of the ordinates represents the intensity I of the drain-source current. It appears that the assembly in which Vgs=Vds is more sensitive to the dissipations of the potential of threshold Vtt of the transistor but, for the same dynamic impedance, it requires a much lower polarization current. As in the example illustrated, the characteristics of transistor assemblies are determined by control loops that take into account the variations of the threshold potential Vtt of the transistors of the different integrated circuits, and the assembly in which Vgs=Vds was selected to minimize static electric consumption. Therefore, the choice must still be made between the two assemblies in FIGS. 7B and 7C, in which Vgs=Vds. Considering the example of selecting the active transistors in parallel in each system by activating their grids, the assembly in FIG. 7C offers the advantage of having the drains at a fixed potential and thereby facilitating grid control. The resistive bridge 17 of the receiver 12 illustrated in FIG. 4 and the resistive bridges 17' of the impedance adaptation block 15 in FIG. 2 therefore use the assembly in FIG. 7C. Advantageously, one of the sixteen transistors N1 and one of the sixteen transistors P1 is a standard transistor always made passing, so that the selective activation concerns the other fifteen transistors. These fifteen transistors are not identical, but are sized so that the addition of one selected transistor increases the total size of the active transistors by a constant percentage. The transistors made active are therefore larger and larger. In other words, the resistors that form transistor groups N1 and P1 are sized so that activating them successively results in steadily decreasing values of the equivalent resistance of these groups. For a given accuracy, on the other hand, this results in an increase in the number of resistors and hence in control signals. To compensate for this disadvantage, an encoded control signal is used.

The most difficult problem to solve in the production of the control loops is making the equivalent impedance of the resistive bridge 17 constantly equal to the characteristic impedance Zc of line 13. Due to the technological drift of the elements contained in the different integrated circuits, resistors N1 and P1 are adjusted in reference to a standard resistor with the desired value which is not integrated into the IC circuit. To make the comparison of the input resistor of receiver 12 with the reference resistor Rr, the choice was made in the example illustrated in FIG. 2 to use the structure 16 of the output stage Ne, Pe of transmitter 11, reproducing it in the structure 16' made of the same transistors N'e and P'e and in sizing it in such a way as to produce a voltage deviation defined in reference resistor Rr, and also using output stage 16 to produce a current identical to that of output stage 16' and obtaining the same voltage deviation. Both identical output stages 16' and 16 therefore produce identical potentials, the first in reference resistor Rr and the second in resistive bridge 17. This ensures that the resistive bridge has equivalent resistance equal to the reference resistor.

The problem is more complex, since the voltage deviation, under the conditions of the illustrated example, is not a predefined voltage or does not refer to a power supply potential, rather it is centered around a threshold potential Vtt which is not predefined and which depends on the manufacturing process, the supply voltage and the temperature. To solve this problem, the schematic circuit description illustrated in FIG. 9 is used, based on the fact that resistive bridge 17 is equivalent to the characteristic resistor Zc connected to a source of potential equal to Vtt and the voltage deviation of the transmission output signal Ve-out is identified by its low potential Vl and its high potential Vh.

In FIG. 9, the two transistors Ne and Pe are considered to supply a current equivalent to the groups of transistors Ne and Pe of the transmitter's output stage 16. Transistor Ne has its source in the power supply potential Vss and its drain in low potential Vl, whereas transistor Pe has its source in potential Vdd and its drain in the high potential Vh. In resistor Zc connected to threshold potential Vtt of the input of receiver 12, transistor Pe generates a voltage deviation Vh−Vtt equal to half the total deviation Vh−Vl, whereas transistor Ne generates the equal and opposite deviation, Vtt−Vl. Output stage 16 of transmitter 11 can thus be considered as a group of transistors Ne and an assembly of transistors Pe interconnected by a reference resistor RR with a value of 2Zc and each is controlled so that, at both ends of reference resistor RR, there are two low Vl and high Vh potentials centered around threshold voltage Vtt and determined by the deviation of the desired voltage. Structure 16' of the impedance adaptation block 14 is thus the desired reference copy of the output stage 16 of the transmitter 11. The conditions that determine this reference copy are recopied in transmitter 11 by control loops Len and Lep to be perfectly adapted to transmission line 13 and produce the desired potentials.

The four control loops may be analog or digital. The choice was made to make them totally digital to withstand noise and to make them easily portable by different manufacturing processes. In the example illustrated, selection circuits 19n, 19p and 25n, 25p are each made of an up-down counter. A sequencer generates clock signals to control the four loops alternatively. The clock signals control the up-down counters based on the result provided by comparators 18n, 18p and 24n, 24p. The comparators are preferably comprised of CMOS inverters, whose switching threshold is determined by the respective sizing of the two complementary transistors that comprise these inverters.

In the example illustrated, the two reference potentials selected are threshold potential Vtt and the deviation's low level Vl. The high level Vh is defined by symmetry relative to Vtt. Moreover, the comparators relative to the two reference potentials Vl and Vtt were chosen from two different types. Comparators 18n and 24n relative to Vtt are each made of one centered inverter, identical to amplifier Nr, Pr of receiver 12 whose threshold is Vtt, and the comparators relative to Vl are each made of one off-center inverter so that its switching threshold is less than Vtt by 0.4 volts, since the peak-to-peak amplitude was chosen to be equal to 0.8 volts.

In the structure selected in the example illustrated, the two inverters 18n, 18p and 24n, 24p, transistors Ne, Pe that comprise output stage 16 of transmitter 11 and transistors N1, P1 of resistive bridge 17 of the receiver are the only elements with linear performance in the entire assembly built into the integrated circuit IC illustrated in FIG. 1 and comprised of impedance adaptation device 10, the transmitters 11 and the receivers 12. To change technology, according to the characteristics of the process for manufacturing the integrated circuit IC, it suffices to adjust the relative sizing of the CMOS transistors that comprise the two inverters and the "absolute" sizing of the transmitter's and the receiver's transistors so they provide the desired impedances. The remainder of the components used are purely digital and are highly insensitive to changes in manufacturing technology.

The operation of the two transmitter control loops Len and Lep are now clearly visible by referring to FIGS. 2 and 3. In block 14, the two loops regulate transistors groups N'e and P'e respectively by making them deliver into reference resistor Rr equal to 2Zc. Transistor group N'e is controlled by the up-down counter 19n in response to the output signal of comparator 18n. If the potential at point A is greater than the low level Vl, the number of active transistors N'e is increased to make the group less resistive and to return the potential at point A to the value Vl. Conversely, the number of active transistors N'e is decreased if the potential at point A is lower than Vl to adjust it to this value. The transistor group P'e is controlled by the up-down counter 19p in response to the output signal of the comparator 18p. If the potential at point C is greater than Vtt, the number of active transistors in the group is decreased to make it more resistive and to return the potential at point C to the Vtt value and vice-versa. The two loops react to each other. Thus, they are advantageously activated sequentially, for example, a clock pulse for one and a clock pulse for the other, and so forth until sixteen pulses are counted for each loop. Both loops will tend toward the desired number of active transistors N'e and P'e in the respective groups. Once this number is reached, the content of up-down counters 19n and 19p varies with each clock pulse by +1 or −1 around the desired value. At the conclusion of the sixteen pulses, the mean of the sixteen values contained in up-down counters 19n and 19p is calculated in encoders 20n and 20p. This mean value is considered the desired value for the number of transistors N'e and P'e active in the respective groups. This value is encoded before being transmitted as an adjustment signal n-em, p-em, so that these signals are not transmitted in a linear manner, as this would make it necessary to distribute a large number of bits in the integrated circuit IC. The Gray code was selected so that only one bit changes at a time. In this manner, there is no danger of going through an intermediate value that is very different from the desired value while the value of the characteristic impedance is being adjusted. In the transmitter 11, the output stage 16 is controlled by signals n-em and p-em to produce the emission current under the desired conditions for adapting the impedance.

The operation of the two receiver control loops Lrn and Lrp will now be described by referring to FIGS. 2 and 4. The mean values transmitted by encoded adjustment signals n-em and p-em are decoded and recopied in the two groups of transistors N"e and P"e which are identical to the two transmission groups N'e and P'e and will be used to control the receiving loops. The two groups of transistors N"e and P"e control the two resistive bridges 17' independently and simultaneously so that the two bridges are identical at all times. Transistor group N"e must draw the potential at point C to low level Vl of the desired transmission. Thus, it is controlled by up-down counter 25n, which itself is controlled by inverter 24n. The principle is similar to that of transmission loops. Furthermore, transistor group P"e must draw the potential at point C to the high level Vh of the desired transmission. Thus, it is controlled here by up-down switch 25p, which itself is controlled by the output of the inverter 24p. This inverter, relative to Vtt, compares the mean potential between the intermediate points of the two bridges 17', one drawn upward by transistors N"e and the other drawn downward by transistors P"e. Obviously, the two loops Lrn and Lrp react to each other. A sequencing identical to that of the two transmission loops is therefore used to calculate the mean value of the sixteen contained in the two up-down switches 25n and 25p and to send them as encoded control signals n-rec and p-rec to the receivers 12 of the integrated circuit IC. In these receivers, the control signals are decoded to adjust the number of transistors N1 and P1 to the respective mean values determined by encoders 26n and 26p. In conclusion, the design solution provided by the invention consists of including the adaptation resistor in the form of the resistive bridge 17 and controlling it so that it has the desired value.

Numerous variants may be made to the example described and illustrated. Thus, it can be seen that the desired structure may be different from the one selected as an example. Technologies other than CMOS technologies are entirely possible. It has been seen that symmetrical amplifiers could be used in a technology other than CMOS or in CMOS technology if a wide bandwidth is not required. In such a case, the receiver would not need a polarization potential. Even in the example illustrated, static consumption could originate from outside the integrated circuit, for example, by adding a power supply terminal to supply potential Vtt.

In summary, in accordance with the impedance adaptation process which has just been described as well as its different variants, first it suffices to determine the desired transmitter and/or receiver structure, for example, the type of structure and it manufacturing technology, as well as the conditions desired for its operation. Then the desired structure is reproduced to create an adaptation structure as in blocks 14 and 15 of the example illustrated. Then the adaptation structure is connected to a reference resistor Rr whose value adapts the impedance of the adaptation structure under the desired operating conditions. Then it suffices to bring the operation of the desired structure under the control of the adaptation structure.

In the example illustrated, the type of structure desired is shown in FIG. 6 and the desired conditions include the desired values of the high and low levels of the signals transmitted and/or received. However, it has been seen that these conditions were required to ensure compatibility with the ECL technology and that they are therefore optional.

In the example illustrated, it has been seen that to obtain the desired values of the high and low levels, the process consists of taking one (Vl) of these two values and determining the other value Vh relative to a third desired voltage value between the two high and low levels and determined by the value of the polarization potential (Vtt) in the desired structure. However, it is equally possible to determine the value of Vtt based on two levels Vl and Vh. In this case, intermediate resistor Ri could be eliminated in the adaptation structure 16'.

In the example illustrated, the desired structure 16 is made based on a CMOS-type inverter (Ne, Pe) in the transmitter. This technology uses a particular type of field effect transistors, but any other type could also be used. In the special case of the structure selected and operating under the conditions that have just been indicated, it has been seen that the invention process consists of connecting in the adaptation structure 16' the reference impedance Rr in series between the complementary transistors of the inverter and giving the reference impedance the value that is twice that of the line's characteristic impedance. In the example illustrated, the reference impedance Rr is not built into the semiconductor material of the integrated circuit IC due to the very large technological dissipations in CMOS technology.

However, and in general, it could be built into or attached to the metal interconnection grid of the integrated circuit in a fixed or adjustable manner by various known means, for example, by laser. The reference resistor could also be built into the semiconductor material of the integrated circuit, for example, as a group of field effect transistors in parallel, duly selected to correspond to the desired value. The solution presented in document EP-A-0504062 consists of controlling the impedances, in the transmitter or high-frequency receiver of an integrated circuit, at an impedance value external to the integrated circuit in order to reproduce that impedance value in the integrated circuit to be used as a reference value and to make the other impedances be this reference value. But this solution can only compensate for a drift of characteristics due to the ageing of the integrated circuit or a change in temperature by making another adjustment to the external resistor. More generally, this solution works well in a substantially less restrictive context than that which has just been addressed. As for the value of the reference impedance, the preceding description has clearly pointed out that the value is 2Zc in the special case of the structure and operation selected as illustrated in FIG. 9. In other words, it could have other values according to the structure and operation selected.

In the example illustrated in FIG. 6, the desired structure also includes a resistive bridge 17 in the receiver 12 to determine the desired polarization potential Vtt. It has been seen in this case that the invention process consists of reproducing the resistive bridge in two adaptation bridges 17', making them operate under the desired transmit and receive conditions, which adapt impedance, and bringing the resistor values of the receiver's resistive bridge under the control of those of the adaptation structure.

It follows that another subject of the invention is a device 10 for adapting impedance to the characteristic impedance Zc of a transmission line 13 between a transmitter 11 and a receiver 12, including in the transmitter and/or the receiver a desired structure 16, 17 operating under the desired conditions. According to the invention, the device includes an adaptation structure 16, 17 that reproduces the desired structure and is connected to a reference impedance which, under the desired operating conditions, adapts the impedance, and a device to bring the desired structure under the control of the adapted structure.

In the example described, the desired structure includes a CMOS-type inverter 16 in the transmitter 11 and, in the receiver 12, a CMOS-type inverter Nr, Pr polarized by an input resistive bridge 17 and, relative to the adaptation structure 16', the reference impedance Rr is twice the line's characteristic impedance.

On the other hand, the resistive bridge is made of two complementary types of transistors N1, P1 in series between two power supply potentials assembled so that Vgs=Vds and so that their connections with the power supply potentials are the reverse of those of transistors of a CMOS-type inverter. On this occasion it has been seen that other types of resistive bridges were possible with circuits that use field effect transistors.

It has also been seen that the selected control device is digital in type, but that it could also be analog. In the example illustrated, control is continuous and is carried out on mean values to prevent any oscillation of the control values around the mean values. More generally, the control may be intermittent, and carried out only during cyclical moments, or only while the operation of the integrated circuit is being initialized, if usage conditions are relatively stable. The encoders could then be elements of memory. Encoders-decoders are advantageous but optional in terms of their use and type.

The result is that another subject of the invention is an integrated circuit IC, including one transmitter and/or one receiver to be connected by at least one transmission line 13 and adapted to the characteristic impedance of the line in accordance with the process which has just been identified or by incorporating an impedance adaptation device which has been identified. More specifically, the illustrated example shows that the invention could apply to an integrated circuit IC that incorporates only transmitters or only receivers. In the former case, it would only include the transmitters 11 and block 14 connected to the reference resistor Rr. In the latter case, it could incorporate only the receivers 12 and the block 15 in which the receive adaptation structure 16" would be identical to the transmit adaptation structure 16' and connected to reference resistor Rr. This example also shows that the desired operating conditions for the receivers imply a desired operation of the transmitters. Therefore, the invention may be remarkable in transmission systems between several integrated circuits that implement the process of the invention, since the impedance adaptation process implies the use of the desired transmit and receive structures.

Therefore, another subject of the invention is a SYS transmission system as illustrated, for example, in FIG. 10, including integrated circuits IC1, IC2, IC3, . . . each incorporating transmitters and/or receivers and connected between them by the transmission lines 13, and the integrated circuits are of the type which has just been defined.

We claim:

1. A process for adapting an impedance to a characteristic impedance (Zc) of a transmission line (13) that connects a transmitter (11) to a receiver (12), the transmitter having a structure (16) and generating a signal having a low level and a high level and the receiver having a structure (17) responsive to the signal, the process comprising using predetermined values for said low and high levels for the signal, reproducing the structure of the transmitter and/or receiver into a respective adaptation structure (16', 17'), connecting said adaptation structure to a reference impedance (Rr), adapting said adaptation structure to said reference impedance, and bringing (Len, Lep, Lrn, Lrp) the operation of the structure of the transmitter and/or the receiver under the control of said adaptation structure.

2. The process according to claim 1, characterized in that one of the two predetermined values of high and low levels is determined relative to a third predetermined value between the high and low levels and corresponding to a polarization potential (Vtt) of the receiver.

3. The process according to claim 2, characterized in that the structure (16) of the transmitter includes a CMOS inverter (Ne, Pe) having complementary transistors, and said connecting step comprises connecting said reference impedance (Rr) in series between said complementary transistors.

4. The process according to claim 3, characterized in that it consists of providing a reference impedance value that is twice that of the transmissions line's characteristic impedance.

5. The process according to claim 1, characterized in that the structure of the receiver includes a resistive bridge (17) which determines a polarization potential (Vtt), and the process further comprises using said polarization potential as a condition of operation of the receiver, said reproducing step comprises reproducing said resistive bridge into two resistive bridges (17') in said adaptation structure of the receiver, and said bringing step comprises placing said resistive bridge of the receiver under the control of said resistive bridges of said adaptation structure.

6. The process according to claim 2, characterized in that the structure of the receiver includes a resistive bridge (17) which determines said polarization potential (Vtt), and the process further comprises using said polarization potential as a condition of operation of the receiver, said reproducing step comprises reproducing said resistive bridge into two resistive bridges (17') in said adaptation structure of the receiver, and said bringing step comprises placing said resistive bridge of the receiver under the control of said resistive bridges of said adaptation structure.

7. The process according to claim 3, characterized in that the structure of the receiver includes a resistive bridge (17) which determines a polarization potential (Vtt), and the process further comprises using said polarization potential as a condition of operation of the receiver, said reproducing step comprises reproducing said resistive bridge into two resistive bridges (17') in said adaptation structure of the receiver, and said bringing step comprises placing said resistive bridge of the receiver under the control of said resistive bridges of said adaptation structure.

8. The process according to claim 4, characterized in that the structure of the receiver includes a resistive bridge (17) which determines a polarization potential (Vtt), and the process further comprises using said polarization potential as a condition of operation of the receiver, said reproducing step comprises reproducing said resistive bridge into two resistive bridges (17') in said adaptation structure of the receiver, and said bringing step comprises placing said resistive bridge of the receiver under the control of said resistive bridges of said adaptation structure.

9. Input impedance adaptation device (10) to adapt an impedance to the characteristic impedance of a transmission line that connects a transmitter (11) to a receiver (12) the transmitter having a structure (16) and generating a signal having a low level and a high level and the receiver having a structure (17) responsive to the signal, the device comprising an adaptation structure (16', 17') which reproduces the structure of the transmitter and/or receiver and is connected to a reference impedance (Rr), means for adapting said adaptation structure to said reference impedance, and closed loop control means (Len, Lep, Lrn, Lrp) connected to bring the structure of the transmitter and/or the receiver under the control of said adaptation structure.

10. A device according to claim 9, characterized in that the structure of the transmitter includes a CMOS-type inverter (16), and the structure of the receiver includes a CMOS-type inverter (Nr, Pr) polarized by an input resistive bridge (17).

11. A device according to claim 9, characterized in that the reference impedance (Rr) is twice the line's characteristic impedance.

12. A device according to claim 10, characterized in that the reference impedance (Rr) is twice the line's characteristic impedance.

13. A device according to claim 9, characterized in that the structure of the receiver comprises a resistive bridge (17) having two complementary types of transistors (N1, P1) in series between two power supply potentials, each having a gate to source voltage equal to a drain to source voltage and arranged so that their connections with said power supply potentials are the reverse of those of the transistors of a CMOS-type inverter.

14. A device according to claim 10, characterized in that the structure of the receiver comprises a resistive bridge (17) having two complementary types of transistors (N1, P1) in series between two power supply potentials, each having a gate to source voltage equal to a drain to source voltage and arranged so that their connections with said power supply potentials are the reverse of those of the transistors of a CMOS-type inverter.

15. A device according to claim 9, characterized in that said control means is digital in type.

16. A device according to claim 10, characterized in that said control means is digital in type.

17. A device according to claim 11, characterized in that said control means is digital in type.

18. A device according to claim 12, characterized in that said control means is digital in type.

19. A device according to claim 13, characterized in that said control means is digital in type.

20. A device according to claim 14, characterized in that said control means is digital in type.

21. A device according to claim 13, characterized in that said control means processes mean values.

22. A device according to claim 14, characterized in that said control means processes mean values.

* * * * *